(12) United States Patent
Minami

(10) Patent No.: US 9,231,101 B2
(45) Date of Patent: Jan. 5, 2016

(54) SEMICONDUCTOR DEVICE AND METHOD OF MANUFACTURING THE SAME

(71) Applicant: SEIKO INSTRUMENTS INC., Chiba-shi, Chiba (JP)

(72) Inventor: Yukimasa Minami, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/478,044

(22) Filed: Sep. 5, 2014

(65) Prior Publication Data

US 2014/0374821 A1    Dec. 25, 2014

Related U.S. Application Data

(62) Division of application No. 13/761,304, filed on Feb. 7, 2013, now Pat. No. 8,859,369.

(30) Foreign Application Priority Data

Feb. 28, 2012    (JP) .................................. 2012-042052

(51) Int. Cl.
*H01L 29/78*    (2006.01)
*H01L 29/10*    (2006.01)
*H01L 29/66*    (2006.01)
*H01L 29/06*    (2006.01)
H01L 21/265    (2006.01)
H01L 29/08    (2006.01)

(52) U.S. Cl.
CPC ........ *H01L 29/7813* (2013.01); *H01L 29/0623* (2013.01); *H01L 29/0634* (2013.01); *H01L 29/0878* (2013.01); *H01L 29/1095* (2013.01); *H01L 29/66666* (2013.01); *H01L 29/66734* (2013.01); *H01L 29/7809* (2013.01); *H01L 29/7827* (2013.01); *H01L 21/26586* (2013.01); *H01L 29/0886* (2013.01)

(58) Field of Classification Search
CPC ..... H01L 29/78; H01L 29/10; H01L 29/7813; H01L 29/1095; H01L 29/772; H01L 29/66734; H01L 29/66666; H01L 29/41741; H01L 29/66621; H01L 29/7397; H01L 29/109
USPC ......... 257/330, 328, 332, 302, 135, 322, 329, 257/331, 333, 301
See application file for complete search history.

(56) References Cited

U.S. PATENT DOCUMENTS

| | | | |
|---|---|---|---|
| 6,511,885 B2 | 1/2003 | Harada et al. | 438/270 |
| 8,058,685 B2 | 11/2011 | Hsieh | 257/330 |
| 2004/0227182 A1 | 11/2004 | Darwish et al. | 257/330 |
| 2007/0241394 A1 | 10/2007 | Takaya et al. | 257/330 |
| 2010/0219461 A1 | 9/2010 | Rinehimer | 257/328 |
| 2012/0074490 A1* | 3/2012 | Saitoh | 257/332 |
| 2013/0299901 A1* | 11/2013 | Hsieh | 257/330 |

FOREIGN PATENT DOCUMENTS

JP    2002299619    10/2002

* cited by examiner

*Primary Examiner* — Chuong A Luu
(74) *Attorney, Agent, or Firm* — Adams & Wilks

(57) ABSTRACT

A semiconductor device includes a semiconductor substrate, a body region, a body contact region and a cancelling region each of the first conductivity type, and a buried layer, an epitaxial layer and a source region each of the second conductivity type. A trench is provided in the epitaxial layer from a surface thereof. A gate insulating film is provided on an inner wall of the trench, and a gate electrode made of polycrystalline silicon is in contact with the gate insulating film and fills the trench. The cancelling region, which is provided below a bottom surface of the trench for cancelling a conductivity type of the buried layer, has a distribution center located below a boundary surface between the buried layer and the epitaxial layer. A trench bottom surface lower region of the first conductivity type is provided from the bottom surface of the trench continuously to the cancelling region.

9 Claims, 3 Drawing Sheets

SEMICONDUCTOR DEVICE AND METHOD OF MANUFACTURING THE SAME

This application is a DIV of 13/761,304 filed on Feb. 7, 2013 now U.S. Pat. No. 8,859,369.

BACKGROUND OF THE INVENTION

1. Field of the Invention

The present invention relates to a semiconductor device having a vertical MOS transistor with a trench gate structure and a method of manufacturing the semiconductor device.

2. Description of the Related Art

In recent years, a wide variety of mobile devices have been distributed. As power sources for those mobile devices, Li-ion batteries have been heavily used, which have high energy density without generating memory effect. Along therewith, a protection IC for detecting overcharge and overdischarge of the Li-ion battery has become essential. For example, a Li-ion battery for mobile phones has a battery voltage of about 3.6 V, but a voltage of 20 V or more may be applied during charging. Accordingly it is required that the IC includes an element having a high breakdown voltage.

In this case, when a CMOS transistor process is used to satisfy the specification of the above-mentioned IC, it is necessary that the process can form a MOS transistor suitable for low voltage use and a MOS transistor suitable for high voltage use. This is because, the final chip size increases when the entire IC is formed of high breakdown voltage elements since the high breakdown voltage element needs to have a certain element size in order to satisfy its specification, with the result that the IC has no cost-competitiveness, and it becomes difficult to satisfy the demand for market price. Consequently the chip size is reduced by using high breakdown voltage elements in circuit areas to which a high voltage is applied, and using low breakdown voltage elements in other circuit areas. Further, when a power MOSFET is used for the protection IC, the demand for the on-resistance of the power MOSFET is as low as about 10 mΩ·mm². Since the power MOSFET occupies a much part of the entire chip, the performance improvement of the power MOSFET significantly contributes to the reduction in chip size.

When focusing on the power MOSFET, there has been proposed a MOS transistor having a structure in which a trench is used to form a vertical channel as illustrated in FIG. 3. In the conventional vertical MOS transistor, as a drain region, an N-type buried layer 302 and an N-type epi-layer 303 for relaxing an electric field are formed on a P-type semiconductor substrate 301. Further on a surface thereof, a P-type body region 304, an N-type source high concentration region 306 as a source, and a P-type body contact region 307 are formed by ion implantation, thermal diffusion, and the like. Then, from a surface thereof, a trench 308 reaching the N-type epi-layer 303 is formed, and a side wall of the trench 308 is formed as a gate insulating film 310. Further, a gate electrode 311 is filled in the trench 308. Note that, an insulating film is formed on the gate electrode 311 for insulation with respect to the N-type source high concentration region 306, and the N-type source high concentration region 306 and the P-type body contact region 307 are electrically connected to each other by a source electrode formed on the insulating film. In this vertical MOS transistor, a part of the P-type body region 304 in the vicinity of the gate insulating film 310, which is sandwiched between the N-type epi-layer 303 and the N-type source high concentration region 306, becomes a channel. The current path is therefore vertical, and high integration is possible while maintaining the breakdown voltage. Accordingly, as compared to a lateral MOS transistor having a lateral channel, a lower resistance can be obtained when the transistor is turned ON.

Further, as a method of reducing the on-resistance in the vertical MOS transistor, there are such methods of increasing the concentration of the N-type epi-layer 303 of the drain, or locating the gate electrode closer to the N-type buried layer 302 of the drain. However, in any of those cases, the element on-resistance and the gate-drain breakdown voltage have a trade-off relationship, and hence there has been a problem in that a comprehensive performance improvement becomes difficult.

To address this problem, Japanese Published Patent Application 2002-299619 discloses a structure capable of improving the breakdown voltage while suppressing the increase in on-resistance. As illustrated in FIG. 4, a gate insulating film having two different thicknesses is formed so that a gate insulating film 312 at a bottom portion of the trench is thicker than a gate insulating film at a side surface thereof, to thereby improve the breakdown voltage between the drain and the gate. As an example of a method of forming the gate insulating film having two different thicknesses, a thin gate insulating film and a thin nitride film are formed on an inner surface of the trench, and deposition of an insulating film and etching are repeated so that a second trench is further formed in the trench. In this manner, a thick gate insulating film and a thin gate insulating film are formed in the trench.

However crystal defects are easily generated due to strain stress at the boundary between the thick gate oxide film and the thin gate oxide film since a stepped oxide film is formed. As a result, as compared to an oxide film having no thickness boundary, the long-term reliability of the gate oxide film may be degraded.

SUMMARY OF THE INVENTION

The present invention has been made in view of the above-mentioned problem, and has an object to provide a semiconductor device having a vertical MOS transistor with a trench gate structure and a method of manufacturing the same, which are capable of improving a breakdown voltage between a drain and a gate without diminishing a long-term reliability of a gate oxide film while suppressing increase in on-resistance.

In order to solve the above-mentioned problem, according to a first embodiment of the present invention, there is provided a method of manufacturing a semiconductor device, including:

forming, on a semiconductor substrate of a first conductivity type, a buried layer of a second conductivity type;

forming an epitaxial layer of the second conductivity type on the buried layer;

forming a trench in the epitaxial layer;

forming a cancelling region of the first conductivity type below a bottom surface of the trench, for cancelling a conductivity type of the buried layer, the cancelling region having a distribution center located below a boundary surface between the buried layer and the epitaxial layer;

forming a body region of the first conductivity type in the epitaxial layer at a periphery of a side surface of the trench, and simultaneously forming a trench bottom surface lower region of the first conductivity type below the bottom surface of the trench, the trench bottom surface lower region being continuous to the cancelling region;

forming a gate insulating film on an inner wall of the trench;

filling polycrystalline silicon in the trench so as to be brought into contact with the gate insulating film, to thereby form a gate electrode;

forming a source region of the second conductivity type in a surface of the body region; and forming a body contact region of the first conductivity type in the surface of the body region.

Further, there is provided a semiconductor device, including:

a semiconductor substrate of a first conductivity type;

a buried layer of a second conductivity type, which is provided on a surface of the semiconductor substrate;

an epitaxial layer of the second conductivity type, which is provided on the buried layer;

a trench provided in the epitaxial layer from a surface of the epitaxial layer;

a cancelling region of the first conductivity type, which is provided below a bottom surface of the trench, for cancelling a conductivity type of the buried layer, the cancelling region having a distribution center located below a boundary surface between the buried layer and the epitaxial layer;

a body region of the first conductivity type, which is provided in the epitaxial layer at a periphery of a side surface of the trench;

a trench bottom surface lower region of the first conductivity type, which is provided from the bottom surface of the trench continuously to the cancelling region;

a gate insulating film provided on an inner wall of the trench;

a gate electrode made of polycrystalline silicon, which is brought into contact with the gate insulating film and fills the trench;

a source region of the second conductivity type, which is provided in a surface of the body region; and a body contact region of the first conductivity type, which is provided in the surface of the body region.

According to a second embodiment of the present invention, there is provided a method of manufacturing a semiconductor device, including:

forming, on a semiconductor substrate of a first conductivity type, an epitaxial layer of a second conductivity type;

forming a trench in the epitaxial layer of the second conductivity type;

forming a sacrificial oxide film on a surface of the semiconductor substrate and an inner wall of the trench;

arranging a resist inside the trench having the sacrificial oxide film formed thereon, the resist having a thickness that is equal to or smaller than one-half a depth of the trench;

forming, by ion implantation through the sacrificial oxide film and the resist, a buried layer of the second conductivity type at a boundary between the epitaxial layer and the semiconductor substrate;

forming, after the resist is removed, a body region of the first conductivity type in the epitaxial layer at a periphery of a side surface of the trench, and simultaneously forming a trench bottom surface lower region of the first conductivity type below a bottom surface of the trench, the trench bottom surface lower region being continuous to the buried layer;

removing the sacrificial oxide film and forming a gate insulating film on the inner wall of the trench;

filling polycrystalline silicon in the trench so as to be brought into contact with the gate insulating film, to thereby form a gate electrode;

forming a source region of the second conductivity type in a surface of the body region; and forming a body contact region of the first conductivity type in the surface of the body region.

Further, there is provided a semiconductor device, including:

a semiconductor substrate of a first conductivity type;

a buried layer of a second conductivity type, which is provided on a surface of the semiconductor substrate;

an epitaxial layer of the second conductivity type, which is provided on the buried layer;

a trench provided in the epitaxial layer from a surface of the epitaxial layer;

a body region of the first conductivity type, which is provided in the epitaxial layer at a periphery of a side surface of the trench;

a trench bottom surface lower region of the first conductivity type, which is provided from a bottom surface of the trench to the buried layer;

a gate insulating film provided on an inner wall of the trench;

a gate electrode made of polycrystalline silicon, which is brought into contact with the gate insulating film and fills the trench;

a source region of the second conductivity type, which is provided in a surface of the body region; and a body contact region of the first conductivity type, which is provided in the surface of the body region, in which the buried layer is provided in such a position that a bottom portion of the trench bottom surface lower region is positioned deeper than a bottom portion of the epitaxial layer toward the semiconductor substrate.

According to the present invention, it is possible to provide the semiconductor device and the method of manufacturing the same, which are capable of improving a breakdown voltage between a drain and a gate without diminishing a long-term reliability of a gate oxide film while suppressing increase in on-resistance.

DETAILED DESCRIPTION OF THE PREFERRED EMBODIMENTS

FIGS. 1A to 1E illustrate a method of manufacturing a semiconductor device according to a first embodiment of the present invention, and are sectional views illustrating, in the process order, main steps in manufacturing a trench MOSFET.

Figure 1A:
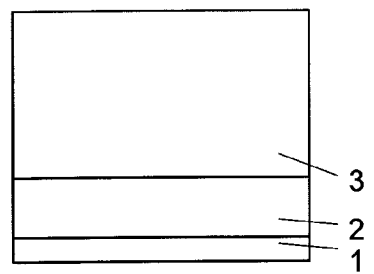
FIGS. 1A to 1E are sectional views illustrating, in the process order, a method of manufacturing a semiconductor device according to a first embodiment of the present invention.

First, a P-type semiconductor substrate 1 is prepared, and as illustrated in FIG. 1A, an N-type high concentration buried layer 2 as a drain is formed by an ion implantation method. Then, an N-type epi-layer 3 is formed on the N-type high concentration buried layer 2 by an epitaxial method. The N-type high concentration buried layer 2 is formed by doping antimony (Sb), arsenic (As), or phosphorus (P) to have a concentration of $5\times10^{18}/cm^3$ to $1\times10^{19}/cm^3$ in order to suppress the drain resistance of the N-type vertical trench MOSFET as much as possible. Further, the settings for the N-type epi-layer 3 are determined based on the performance required for a semiconductor integrated device to be manufactured, such as a breakdown voltage and a driving current of the MOSFET. For example, the N-type epi-layer 3 may have a concentration of $5\times10^{16}/cm^3$ to $2\times10^{17}/cm^3$ and a thickness of about 4.5 µm to 5.0 µm.

Figure 1B:
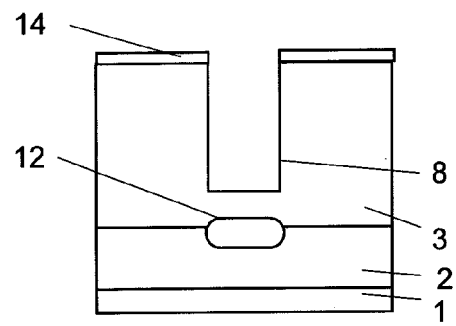

Next, as illustrated in FIG. 1B, in an N-type vertical MOSFET forming region, anisotropic etching is performed toward an inside of the P-type semiconductor substrate 1 with use of a nitride film 14 as a hard mask, to thereby form a trench 8. At this time, the depth of the trench 8 is 1.4 µm to 2.0 µm, and can be appropriately set based on a desired drain breakdown voltage of the transistor.

Further, ion implantation of boron (B) as P-type impurities is performed at high concentration with use of the nitride film 14 as a hard mask so that the center of distribution is located below a boundary surface between the N-type high concentration buried layer 2 and the N-type epi-layer 3. This is performed for cancelling the impurities of the N-type high concentration buried layer 2 as a high concentration drain located below the trench 8 by P-type impurities so that an N-type impurity distribution shape is changed to have a concave shape. Accordingly it is necessary to form a cancelling region 12 in which P-type impurities are ion-implanted to have a concentration equivalent to that of the N-type high concentration buried layer 2.

Figure 1C:
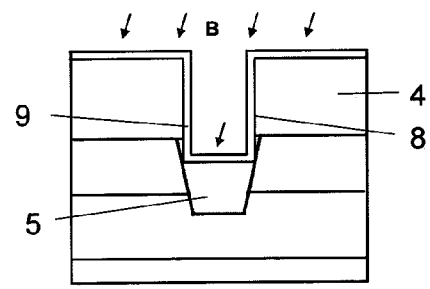

Next, after the hard mask is removed, as illustrated in FIG. 1C, a sacrificial oxide film 9 is formed on the N-type epi-layer 3 and inside the trench 8. The thickness of the sacrificial oxide film 9 may be about 10 nm to 20 nm similarly to a gate insulating film 10. Then, by utilizing the trench shape provided with the sacrificial oxide film 9, a P-type body region 4 is formed at a periphery of the side surface of the trench, at which a channel is formed, by ion implantation and thermal diffusion. Simultaneously, ion implantation is also performed in a trench bottom surface lower region 5, which is communicated to the cancelling region previously formed. At this time, it is desired that a wafer be subjected to step rotation implantation at an angle so that impurities are uniformly implanted into the P-type body region 4 and the trench bottom surface lower region 5. Conditions at this time vary depending on the junction breakdown voltage and driving ability, but it is desired that the impurities be boron (B), the acceleration energy be 150 KeV to 250 KeV, and the impurity concentration be about $1\times10^{17}/cm^3$ to $5\times10^{17}/cm^3$ as a result after cancelling the N-type conductivity of the N-type epi-layer 3. Further, the ion implantation angle is desired to be in a range of 3° to 10°, and four-step 90-degree rotation implantation is desired. Alternatively, ion implantation may be performed a plurality of times while changing the ion implantation energy, thereby obtaining a substantially uniform carrier concentration. With this, there are advantages that fluctuations in threshold voltage and channel resistance (on-resistance) can be reduced.

Figure 1D:
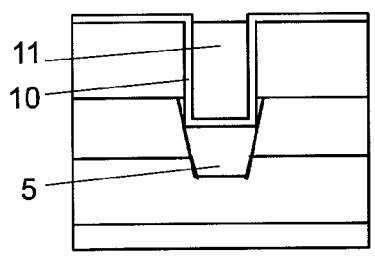

Next, after the sacrificial oxide film 9 is removed, as illustrated in FIG. 1D, the gate insulating film 10 is formed by thermal oxidation along the surface of the N-type epi-layer 3 and the wall surface of the trench. The thickness thereof is set in consideration of a desired gate breakdown voltage of the transistor, which is about 10 nm to 20 nm. Further, the forming temperature of the gate insulating film 10 is from 800° C. to 1,150° C., more preferably from 1,000° C. to 1,150° C.

Next, although not shown, a polycrystalline silicon layer 11 doped in advance with N-type ions is formed on the gate insulating film 10 to have a thickness of about 1 µm to 2 µm by a low pressure CVD method or the like. As another method, an un-doped polycrystalline silicon layer may be formed on the gate insulating film 10, and N-type ions may be implanted a plurality of times, to thereby form the polycrystalline silicon layer 11.

Next, as illustrated in FIG. 1D, the polycrystalline silicon layer 11 is subjected to anisotropic etching, to thereby form an N-type gate electrode 11 filling the trench.

Figure 1E:
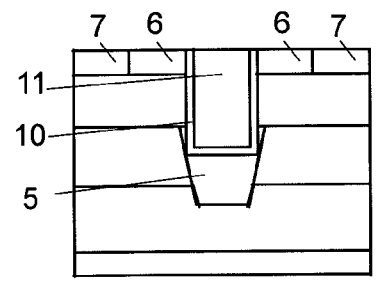

Next, in FIG. 1E, the upper surface of the P-type body region 4 is subjected to ion implantation in order to form an N-type source high concentration region 6. In order to form the N-type source high concentration region 6, for example, ion implantation of As is performed preferably at a dose of about $1\times10^{18}/cm^3$ to $1\times10^{19}/cm^3$ so as to reduce the sheet resistance. As a matter of course, instead of implantation of As, implantation of phosphorus (P) at high concentration may be performed.

After that, as illustrated in FIG. 1E, a P-type body contact region 7 is formed. In order to form the P-type body contact region 7, for example, ion implantation of $BF_2$ is performed preferably at a dose of about $1\times10^{18}/cm^3$ to $1\times10^{19}/cm^3$ so as to reduce the sheet resistance. As a matter of course, implantation of boron (B) at high concentration may be alternatively performed.

Finally, although not shown, an interlayer insulating film is formed. Then, a contact hole is provided in the interlayer insulating film as a hole for electrode formation, and an aluminum electrode is formed.

As described above, it is possible to obtain the trench MOSFET in which a breakdown voltage in an OFF state is improved without diminishing the long-term reliability of the gate oxide film while suppressing increase in on-resistance. This can be obtained because of the following reason. The distance between the gate electrode and the N-type high concentration buried layer below the gate electrode is formed longer than that in the conventional structure, and the P-type trench bottom surface lower region 5 is formed therebetween. In this manner, when a high voltage is applied to the drain region and 0 V is applied to the gate electrode, the trench bottom surface lower region 5 is depleted, thereby improving the breakdown voltage in the OFF state.

Next, a method of manufacturing a semiconductor device according to a second embodiment of the present invention is described.

FIGS. 2A to 2E illustrate sectional views of a trench MOSFET according to the second embodiment in the process order.

Figure 2A:
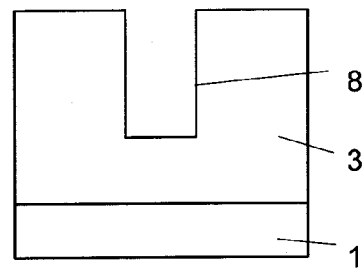
FIGS. 2A to 2E are sectional views illustrating, in the process order, a method of manufacturing a semiconductor device according to a second embodiment of the present invention.

As illustrated in FIG. 2A, on a P-type semiconductor substrate 1, an N-type epi-layer 3 is formed by an epitaxial method. The settings for the N-type epi-layer 3 are determined based on the performance required for a semiconductor integrated device to be manufactured, such as a breakdown voltage and a driving current of the MOSFET. For example, the N-type epi-layer 3 may have a concentration of $5\times10^{16}/cm^3$ to $2\times10^{17}/cm^3$ and a thickness of about 4.5 µm to 5.0 µm. Next, as illustrated in FIG. 2A, in an N-type vertical MOSFET forming region, anisotropic etching is performed toward an inside of the P-type semiconductor substrate 1 with use of a nitride film as a hard mask, to thereby form a trench 8. At this time, the depth of the trench 8 is from 1.4 µm to 2.0 µm, which is smaller than the thickness of the N-type epi-layer 3. The depth of the trench 8 can be appropriately set based on a desired drain breakdown voltage of the transistor.

Figure 2B:
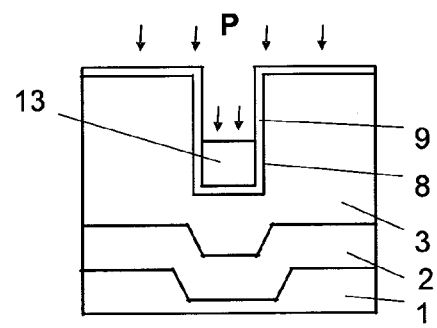

Next, after the nitride film used as the hard mask is removed, as illustrated in FIG. 2B, a sacrificial oxide film 9 is formed on an inner wall of the trench 8. The thickness of the oxide film 9 may be set to, for example, about 20 nm to 100 nm. After that, a resist 13 is applied on the N-type epi-layer 3 filling the trench 8 at the same time, and the resist 13 is retreated from the surface of the substrate by a method such as ashing. Then, as illustrated in FIG. 2B, the thickness of the resist 13 is adjusted so as to be equal to or smaller than about one-half the depth of the trench. Then, with use of the sacrificial oxide film 9 and the resist as masks, an N-type high concentration buried layer 2 is formed by an ion implantation method using high energy of about several MeV. The N-type high concentration buried layer 2 is formed by doping phosphorus (P) to have a concentration of $5 \times 10^{18}/cm^3$ to $1 \times 10^{19}/cm^3$ in order to suppress the drain resistance of the N-type vertical trench MOSFET as much as possible. Further, in order that the N-type ions do not enter the channel forming region, it is desired that the ion implantation be performed at an ion implantation angle of a value close to 0° as much as possible.

Figure 2C:
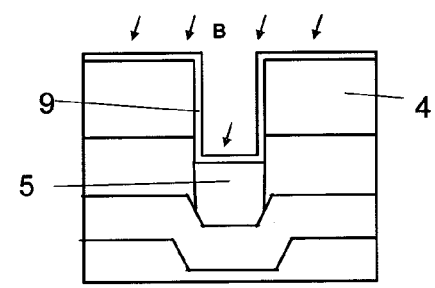

Next, after the resist 13 is removed, as illustrated in FIG. 2C, by utilizing the trench shape provided with only the sacrificial oxide film 9, a P-type body region 4 is formed at a periphery of the side surface of the trench, at which a channel is formed, by ion implantation and thermal diffusion. Simultaneously, ion implantation is also performed in a trench bottom surface lower region 5. At this time, it is desired that a wafer be subjected to step rotation implantation at an angle so that impurities are uniformly implanted into the P-type body region 4 and the trench bottom surface lower region 5. Conditions at this time vary depending on the junction breakdown voltage and driving ability, but it is desired that the impurities be boron (B), the acceleration energy be 150 KeV to 250 KeV, and the impurity concentration be about $1 \times 10^{17}/cm^3$ to $5 \times 10^{17}/cm^3$ as a result after cancelling the N-type conductivity of the N-type epi-layer 3. Further, the ion implantation angle is desired to be in a range of 3° to 10°, and four-step 90-degree rotation implantation is desired.

Alternatively, ion implantation may be performed a plurality of times while changing the ion implantation energy, thereby obtaining a substantially uniform carrier concentration. With this, there are advantages that fluctuations in threshold voltage and channel resistance (on-resistance) can be reduced.

Figure 2D:
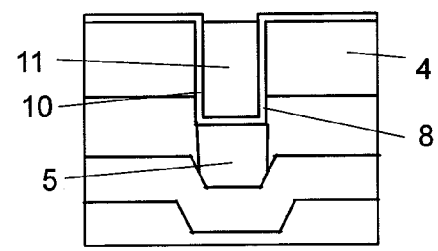

Next, after the sacrificial oxide film 9 is removed, as illustrated in FIG. 2D, a gate insulating film 10 is formed by thermal oxidation along the surface of the N-type epi-layer 3 and the wall surface of the trench. The thickness thereof is set in consideration of a desired gate breakdown voltage of the transistor, which is about 10 nm to 20 nm. Further, the forming temperature of the gate insulating film 10 is from 800° C. to 1,150° C., more preferably from 1,000° C. to 1,150° C.

Next, although not shown, a polycrystalline silicon layer 11 doped in advance with N-type ions is formed on the gate insulating film 10 to have a thickness of about 1 µm to 2 µm by a low pressure CVD method or the like. As another method, an un-doped polycrystalline silicon layer may be formed on the gate insulating film 10, and N-type ions may be implanted a plurality of times, to thereby form the polycrystalline silicon layer 11.

Next, as illustrated in FIG. 2D, the polycrystalline silicon layer 11 is subjected to anisotropic etching, to thereby form an N-type gate electrode 11 inside the trench.

Figure 2E:
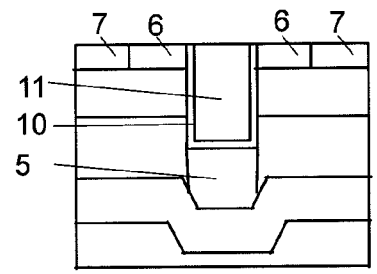
Figure 3:
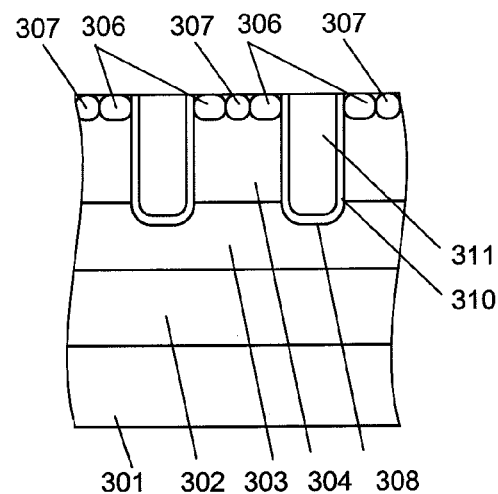
FIG. 3 is a schematic sectional view illustrating a conventional semiconductor device.
Figure 4:
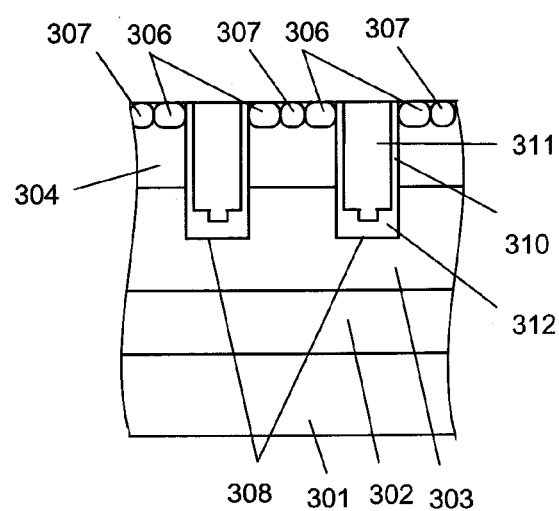
FIG. 4 is a schematic sectional view illustrating a semiconductor device in which a gate oxide film at a bottom portion of a trench is thicker than a gate insulating film at a side surface thereof.

Next, in FIG. 2E, the upper surface of the P-type body region 4 is subjected to ion implantation in order to form an N-type source high concentration region 6. In order to form the N-type source high concentration region 6, for example, ion implantation of As is performed preferably at a dose of about $1 \times 10^{18}/cm^3$ to $1 \times 10^{19}/cm^3$ so as to reduce the sheet resistance. As a matter of course, implantation of phosphorus (P) at high concentration may be alternatively performed.

After that, as illustrated in FIG. 2E, a P-type body contact region 7 is formed. In order to form the P-type body contact region 7, for example, ion implantation of $BF_2$ is performed preferably at a dose of $1 \times 10^{18}/cm^3$ to $1 \times 10^{19}/cm^3$ so as to reduce the sheet resistance. As a matter of course, implantation of boron (B) at high concentration may be alternatively performed.

Finally, although not shown, an interlayer insulating film is formed. Then, a contact hole is provided in the interlayer insulating film as a hole for electrode formation, and an aluminum electrode is formed.

As described above, it is possible to obtain the trench MOSFET in which a breakdown voltage in an OFF state is improved without diminishing the long-term reliability of the gate oxide film while suppressing increase in on-resistance. This can be obtained because of the following reason. The distance between the gate electrode and the N-type high concentration buried layer below the gate electrode is formed longer than that in the conventional structure, and the P-type trench bottom surface lower region 5 is formed therebetween. In this manner, when a high voltage is applied to the drain region and 0 V is applied to the gate electrode, the trench bottom surface lower region 5 is depleted, thereby improving the breakdown voltage in the OFF state.

The following effects can be obtained from the first and second embodiments described above.

Through implantation of P-type impurities by utilizing the trench shape, the trench bottom surface lower region 5 may have an opposite conductivity type. Further, through extension of the distance between the gate and the drain, the electric field to be applied thereto can be relaxed to improve the breakdown voltage.

On the other hand, it is possible to maintain the on-resistance equivalent to the on-resistance of a trench MOSFET manufactured by conventional process conditions since the P-type impurities do not enter the N-type epi-layer 3 below the channel region in which the currents flow due to the utilization of the trench shape in implanting the P-type impurities.

In the above description, the case where the N-type epi-layer 3 is used is described. Alternatively, a P-type epi-layer may be used, and ion implantation of N-type impurities may be performed at the same time as the P-type body region 4 so that a region between the N-type buried layer 2 and the P-type body region 4 is set as an N-type electric field relaxation region. Description as so far is made on the premise of an N-type transistor, but as a matter of course, the present invention is similarly applicable also in the case of a P-type transistor including a P-type buried layer, a P-type epi-layer, and an N-type body region by reversing the conductivity types of all of the semiconductor regions.

Further, no description is made at all of a CMOS to be formed on the same substrate as the vertical trench MOSFET, but the above-mentioned steps do not include steps that interfere the formation of the CMOS, and it is easy to form the trench MOSFET and the CMOS on the same substrate.

What is claimed is:
1. A semiconductor device, comprising:
a semiconductor substrate of a first conductivity type;
a buried layer of a second conductivity type, which is provided on a surface of the semiconductor substrate;

an epitaxial layer of the second conductivity type, which is provided on the buried layer;
a trench provided in the epitaxial layer from a surface of the epitaxial layer;
a cancelling region of the first conductivity type, which is provided below a bottom surface of the trench, for cancelling a conductivity type of the buried layer, the cancelling region having a distribution center located below a boundary surface between the buried layer and the epitaxial layer;
a body region of the first conductivity type, which is provided in the epitaxial layer at a periphery of a side surface of the trench;
a trench bottom surface lower region of the first conductivity type, which is provided from the bottom surface of the trench continuously to the cancelling region;
a gate insulating film provided on an inner wall of the trench;
a gate electrode made of polycrystalline silicon, which is brought into contact with the gate insulating film and fills the trench;
a source region of the second conductivity type, which is provided in a surface of the body region; and
a body contact region of the first conductivity type, which is provided in the surface of the body region.

2. A semiconductor device, comprising:
a semiconductor substrate of a first conductivity type;
a buried layer of a second conductivity type, which is provided on a surface of the semiconductor substrate;
an epitaxial layer of the second conductivity type, which is provided on the buried layer;
a trench provided in the epitaxial layer from a surface of the epitaxial layer;
a body region of the first conductivity type, which is provided in the epitaxial layer at a periphery of a side surface of the trench;
a trench bottom surface lower region of the first conductivity type, which is provided from a bottom surface of the trench to the buried layer;
a gate insulating film provided on an inner wall of the trench;
a gate electrode made of polycrystalline silicon, which is brought into contact with the gate insulating film and fills the trench;
a source region of the second conductivity type, which is provided in a surface of the body region; and
a body contact region of the first conductivity type, which is provided in the surface of the body region,
wherein the buried layer is provided in such a position that a bottom portion of the trench bottom surface lower region is positioned deeper than a bottom portion of the epitaxial layer toward the semiconductor substrate.

3. A semiconductor device, comprising:
a semiconductor substrate of a first conductivity type;
a buried layer of a second conductivity type, which is provided on a surface of the semiconductor substrate;
an epitaxial layer of the second conductivity type, which is provided on the buried layer;
a trench provided in the epitaxial layer from a surface of the epitaxial layer;
a body region of the first conductivity type, which is provided in the epitaxial layer at a periphery of a side surface of the trench;
a trench bottom surface lower region of the first conductivity type, which is provided from a bottom surface of the trench to the buried layer;
a gate insulating film provided on an inner wall of the trench;
a gate electrode made of polycrystalline silicon, which is brought into contact with the gate insulating film and fills the trench;
a source region of the second conductivity type, which is provided in a surface of the body region; and
a body contact region of the first conductivity type, which is provided in the surface of the body region,
wherein a distance from the bottom surface of the trench to the buried layer, which is directly below the trench, is longer than a distance from the body region to the buried layer, which is directly below the body region.

4. A semiconductor device according to claim 1, wherein the trench bottom surface lower region is disposed between the gate electrode and the buried layer.

5. A semiconductor device according to claim 1, wherein the epitaxial layer has a concentration of $5 \times 10^{16}/cm^3$ to $2 \times 10^{17}/cm^3$ and a thickness of 4.5 μm to 5.0 μm.

6. A semiconductor device according to claim 2, wherein the epitaxial layer has a concentration of $5 \times 10^{16}/cm^3$ to $2 \times 10^{17}/cm^3$ and a thickness of 4.5 μm to 5.0 μm.

7. A semiconductor device according to claim 2, wherein the trench bottom surface lower region extends into the buried layer.

8. A semiconductor device according to claim 3, wherein the epitaxial layer has a concentration of $5 \times 10^{16}/cm^3$ to $2 \times 10^{17}/cm^3$ and a thickness of 4.5 μm to 5.0 μm.

9. A semiconductor device according to claim 3, wherein the trench bottom surface lower region extends into the buried layer.

* * * * *